(12) United States Patent
Sato

(10) Patent No.: US 8,171,439 B2
(45) Date of Patent: May 1, 2012

(54) WARNING DEVICE AND WARNING METHOD

(75) Inventor: Mitsuru Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 466 days.

(21) Appl. No.: 12/396,722

(22) Filed: Mar. 3, 2009

(65) Prior Publication Data

US 2009/0249268 A1     Oct. 1, 2009

(30) Foreign Application Priority Data

Mar. 31, 2008   (JP) .................................. 2008-92980

(51) Int. Cl.
    *G06F 9/455*     (2006.01)
    *G06F 17/50*     (2006.01)
(52) U.S. Cl. ......... 716/106; 716/100; 716/111; 716/136
(58) Field of Classification Search .................... 716/52, 716/106, 111, 112, 54, 100, 102, 108, 113, 716/132, 136
See application file for complete search history.

(56) References Cited

U.S. PATENT DOCUMENTS

| | | | |
|---|---|---|---|
| 6,988,238 B1 * | 1/2006 | Kovacevic et al. | 714/799 |
| 2004/0078724 A1 * | 4/2004 | Keller et al. | 714/48 |
| 2009/0031171 A1 * | 1/2009 | Fashchik et al. | 714/38 |

FOREIGN PATENT DOCUMENTS

| | | |
|---|---|---|
| JP | 63-059622 | 3/1988 |
| JP | 10-240789 | 9/1998 |

* cited by examiner

*Primary Examiner* — Thuan Do
*Assistant Examiner* — Brian Ngo
(74) *Attorney, Agent, or Firm* — Staas & Halsey LLP

(57) ABSTRACT

A warning device checks for errors in design object data and issues a warning for detected errors by storing allowance information, which allows issuance of warning prevention, cancel information, which cancels relevant allowance information to permit issuance of warning for each error identification, and instruction identification, which identifies an edit command for editing generated design object data for error identification. When said edit command is accepted, the error identification for the instruction identification of edit command is acquired. Cancel information can be registered for error identification. Respective errors corresponding to error identifications are checked, when an operation for checking the design object data is accepted, and when a type of an error is identified, whether to issue a warning based on the allowance information and cancel information for relevant error identification is determined.

4 Claims, 14 Drawing Sheets

FIG. 4A
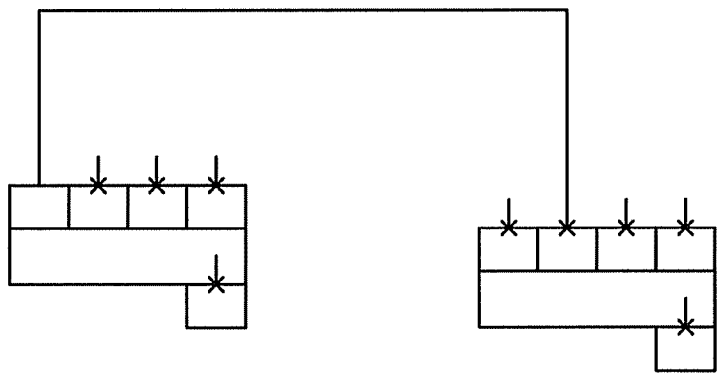
FIG. 4B
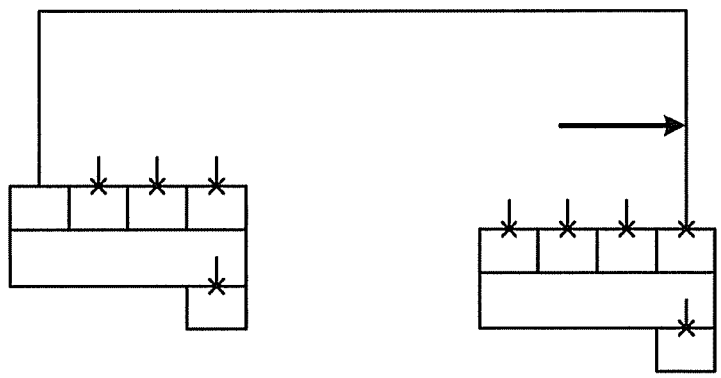
FIG. 4C
| EDIT COMMAND NAME | EDIT DESCRIPTION |
|---|---|
| MOVE | MOVE SELECTED COMPONENT AND NET |
| CHANGE NAME | CHANGE NAMES OF SELECTED COMPONENT AND NET |
| CHANGE ATTRIBUTE | CHANGE ATTRIBUTES OF SELECTED COMPONENT AND NET |
| COPY | COPY SELECTED COMPONENT AND NET |
| DELETE | DELETE SELECTED COMPONENT AND NET |

FIG. 5A

| ERROR ID |  |
|---|---|
| ERROR TARGET | ID |
|  | TYPE |
| ERROR ALLOWANCE OK/NOT OK | |
| DISABLING ON/OFF | |

FIG. 5B

| No. | ERROR ID | PERMITTER NAME | REASON FOR ALLOWANCE | ... | ERROR TARGET | | ERROR ALLOWANCE INFORMATION | DISABLING INFORMATION |
|---|---|---|---|---|---|---|---|---|
| | | | | | ID | TYPE | | |
| 1 | ID OF "ALL COMPONENT PINS ARE UNUSED" | XXX | ○○ | | ID OF COMPONENT R1 | COMPONENT | OK | OFF |
| 2 | ID OF "THERE ARE NO INPUT/ OUTPUT PINS IN ONE NET" | YYY | ×× | | ID OF NET N1 | NET | OK | OFF |
| 3 | ID OF "INPUT ERROR OF COMPONENT ATTRIBUTE" | ZZZ | △△ | | ID OF COMPONENT R1 | COMPONENT | OK | OFF |

FIG. 6A

| COMMAND ID | ERROR TYPE ID [0] <br> : <br> ERROR TYPE ID [L] |
|---|---|
| COMMAND ID | ERROR TYPE ID [0] <br> : <br> ERROR TYPE ID [M] |
| COMMAND ID | ERROR TYPE ID [0] <br> : <br> ERROR TYPE ID [N] |

FIG. 6B

| COMMAND ID | ERROR TYPE ID |
|---|---|
| MOVE (ID=X) | THERE ARE NO INPUT/OUTPUT PINS IN ONE NET (ID=Y) <br> : <br> : |
| COMMAND ID | ERROR TYPE ID |
| | : <br> : |

FIG. 10A

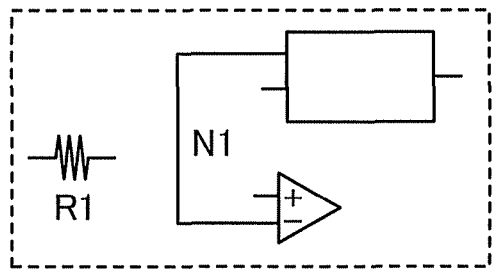

FIG. 10B

| CHECK TYPE | TYPE | CHECK DESCRIPTION |
|---|---|---|
| ALL COMPONENT PINS ARE UNUSED | COMPONENT | ALL COMPONENT PINS ARE USED? |
| THERE ARE NO INPUT/OUTPUT PINS IN ONE NET | NET | CONNECTION IS MADE TO INPUT AND OUTPUT PINS? |
| INPUT ERROR OF COMPONENT ATTRIBUTE | COMPONENT | ATTRIBUTE VIOLATES DESIGN RULE? |

FIG. 10C

| No. | CHECK TYPE | TARGET COMPONENT |
|---|---|---|
| 1 | ALL COMPONENT PINS ARE UNUSED | COMPONENT R1 |
| 2 | THERE ARE NO INPUT/OUTPUT PINS IN ONE NET | NET N1 |
| 3 | INPUT ERROR OF COMPONENT ATTRIBUTE | COMPONENT R1 |

FIG. 10D

| EDIT COMMAND NAME | CHECK TYPE THAT REQUIRES DISABLING |
|---|---|
| MOVE | ALL COMPONENT PINS ARE UNUSED |
| | THERE ARE NO INPUT/OUTPUT PINS IN ONE NET |
| CHANGE NAME | N/A |
| CHANGE ATTRIBUTE | INPUT ERROR OF COMPONENT ATTRIBUTE |
| COPY | ALL COMPONENT PINS ARE UNUSED |
| | THERE ARE NO INPUT/OUTPUT PINS IN ONE NET |

FIG. 11A

| ERROR ID | ERROR TARGET ID | ERROR ALLOWANCE INFORMATION | DISABLING INFORMATION |
|---|---|---|---|
| E1 | R1 | OK | OFF |
| E2 | N1 | OK | OFF |
| E3 | R1 | OK | OFF |

FIG. 11B

| COMMAND ID | ERROR ID |
|---|---|
| C1 | E1 |
| C1 | E2 |
| C2 |  |
| C3 | E3 |
| C4 | E1 |
| C4 | E2 |

FIG. 11C

| ERROR TARGET ID | ERROR TARGET ID OF CONNECTION DESTINATION |
|---|---|
| R1 |  |
| N1 | R2,R3 |

FIG. 12A-1
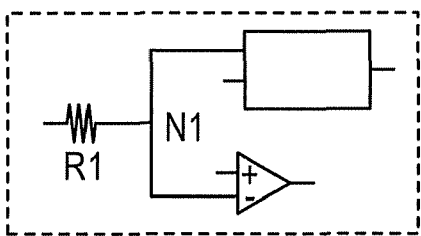
FIG. 12A-2
| ERROR TARGET ID | ERROR TARGET ID OF CONNECTION DESTINATION |
|---|---|
| R1 | N1 |
| R2 | R1,R2,R3 |
FIG. 12B
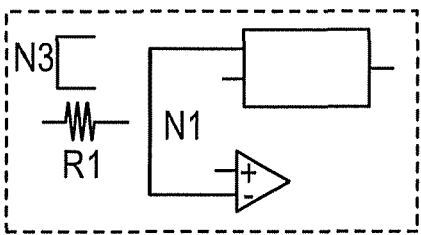
FIG. 12C
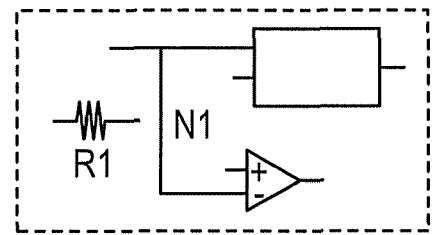
FIG. 12D-1
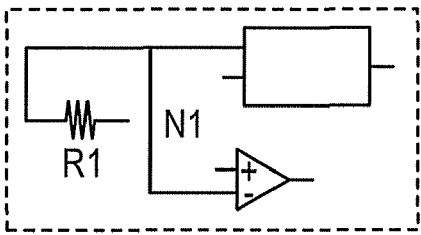
FIG. 12D-2
| ERROR TARGET ID | ERROR TARGET ID OF CONNECTION DESTINATION |
|---|---|
| R1 | N1 |
| R2 | R1,R2,R3 |
FIG. 12E-1
| ERROR ID | ERROR TARGET ID | ERROR ALLOWANCE INFORMATION | DISABLING INFORMATION |
|---|---|---|---|
| E2 | N1 | OK | OFF |
FIG. 12E-2
| ERROR TARGET ID | ERROR TARGET ID OF CONNECTION DESTINATION |
|---|---|
| N1 | R2,R3 |

WARNING DEVICE AND WARNING METHOD

CROSS-REFERENCE TO RELATED APPLICATIONS

This application is based upon and claims the benefit of priority from the prior Japanese Patent Application No. 2008-92980 filed on Mar. 31, 2008, the entire contents of which are incorporated herein by reference.

BACKGROUND

1. Field

An aspect of the present invention relates to computer circuit design.

2. Description of the Related Art

Conventionally, development of printed boards is performed according to a development flow as shown in FIG. 1A. There is an application for circuit design used in "circuit design" and the like in this development flow (see FIG. 1B).

The application for circuit design is provided with a design rule check mechanism (see Japanese Laid-open Patent Publication No. H10-240789).

The design rule check mechanism is a mechanism which checks for errors with respect to check items, for example, checks if characters do not overlap with graphics, checks if an input pin and an output pin are used, etc. in a circuit diagram in which a circuit is drawn, and issues a warning to a user when an error is detected (see FIG. 1C).

For avoiding a troublesome situation where warnings are repeatedly issued with respect to the same error, the design rule check mechanism has an "allowance setting" for suspending issue of warning.

In one specific example, a circuit designing device (for example, a CAD (Computer Aided Design) device) having an application for circuit design stores an error ID which identifies a respective error in association with error allowance information which allows issue of warning to be prevented.

If a user checks an error description on receipt of a warning and inputs a command intended to suspend issue of warning about this error, the error allowance information is switched from "Not OK" indicating the error causes issue of warning to "OK" indicating the error does not cause issue of warning.

During execution of design rule check, the circuit designing device checks error allowance information stored in association with an error ID, and if the error allowance information is stored as "Not OK", issues a warning, and if it is stored as "OK", suspends issue of warning (see FIG. 1D). It is noted that FIGS. 1C, and 1D are diagrams showing an overview of the conventional art.

SUMMARY

According to a warning device and warning method disclosed herein, errors can be prevented from being unnoticed.

A warning device which checks error in design object data and issues a warning for detected error includes a unit to store allowance information which allows issue of warning prevention and cancel information which cancels relevant allowance information to permit issue of warning for each error identification, a unit to store instruction identification which identifies an edit command for editing generated design object data for error identification, a unit to, when said edit command is accepted, acquire the error identification for the instruction identification of edit command, a unit to register cancel information for error identification, a unit to check respective error corresponding to error identification when an operation for checking the design object data is accepted, a unit to, for error identification corresponding to an error, determine whether to issue a warning based on the allowance information and cancel information for relevant error identification, and a unit to issue warning if determined to be issued.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIGS. 4A, 4B, and 4C are diagrams illustrating edit commands;

FIGS. 5A and 5B are diagrams illustrating information stored in an error allowance information DB;

FIGS. 6A and 6B are diagrams illustrating information stored in a command table;

FIGS. 10A, 10B, 10C, and 10D are diagrams illustrating an example of the circuit designing device;

FIGS. 11A, 11B, and 11C are diagrams illustrating an example of the circuit designing device; and FIGS. 12A-1, 12A-2, 12B, 12C, 12D-1, 12D-2, 12E-1, and 12E-2 are diagrams illustrating an example of the circuit designing device.

DETAILED DESCRIPTION OF THE PREFERRED EMBODIMENTS

Hereinafter, embodiments of the warning device and warning method according to the present invention will be described in detail with reference to the accompanying drawings. A circuit designing device in which the present invention is implemented (for example, a CAD device) will be described as an embodiment below.

Embodiment 1

In the following description of embodiment 1, an overview and characteristics, a configuration, a process flow, and an example of processing of the circuit designing device according to embodiment 1 will be described successively, and the advantage of embodiment 1 will be described finally.

Overview and Characteristics of the Circuit Designing Device of Embodiment 1

First, the overview and characteristics of the circuit designing device of embodiment 1 will be described using FIG. 2. FIG. 2 is a diagram illustrating an overview and characteristics of a circuit designing device according to embodiment 1.

Generally, the circuit designing device of embodiment 1 accepts a draw command for drawing a circuit diagram and generates the circuit diagram, and further checks for errors in the generated circuit diagram and issues a warning with respect to each detected error, and is characterized by preventing errors from being unnoticed.

Figure 1A:
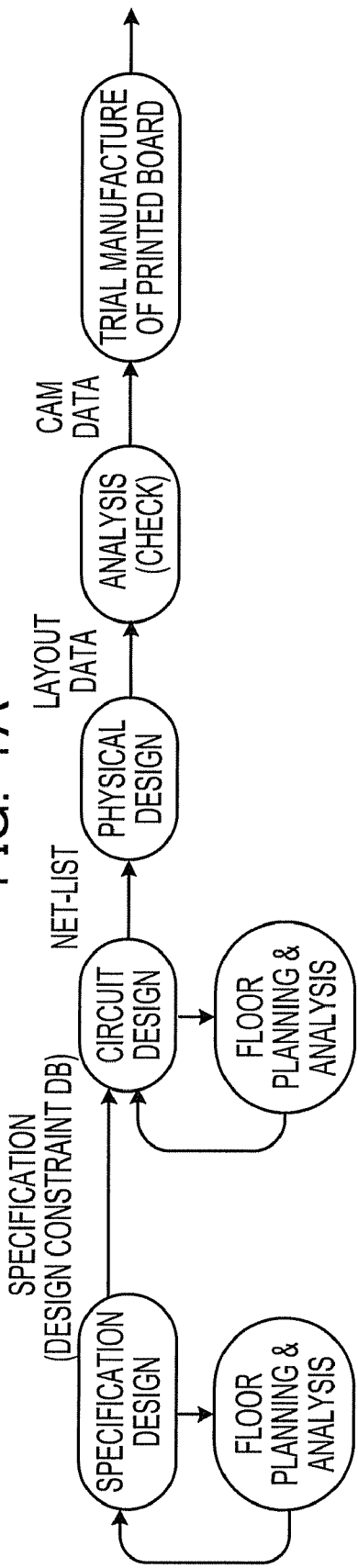
FIGS. 1A and 1B are diagrams showing an overview of the operations and function in which the invention can be embodied.
Figure 1B:
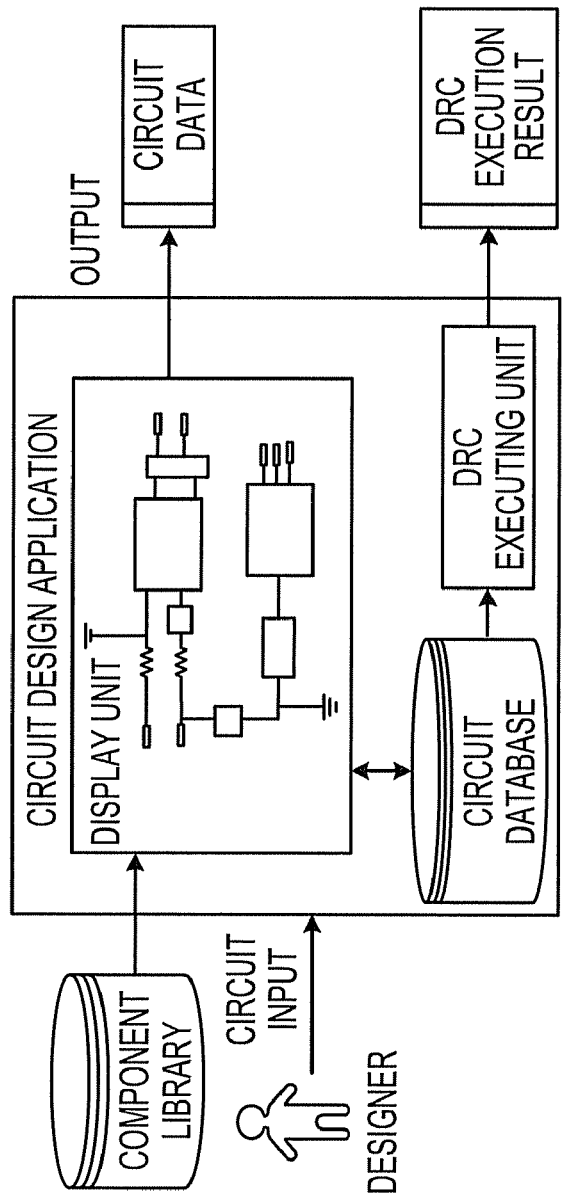
Figure 1C:
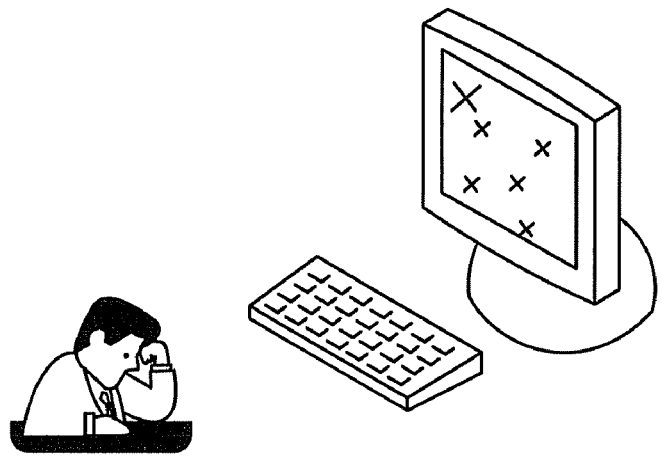
FIGS. 1C and 1D are diagrams showing an overview of operations of the conventional art.
Figure 1D:
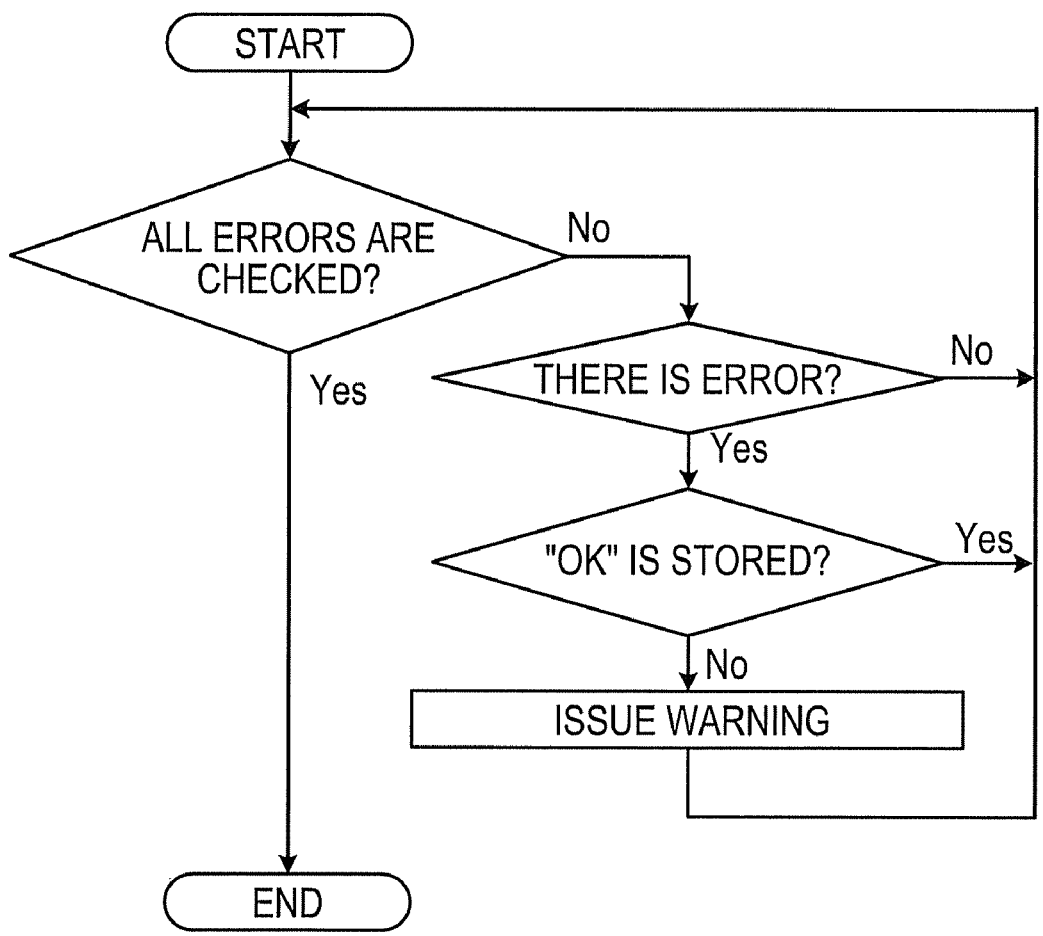
Figure 2A:
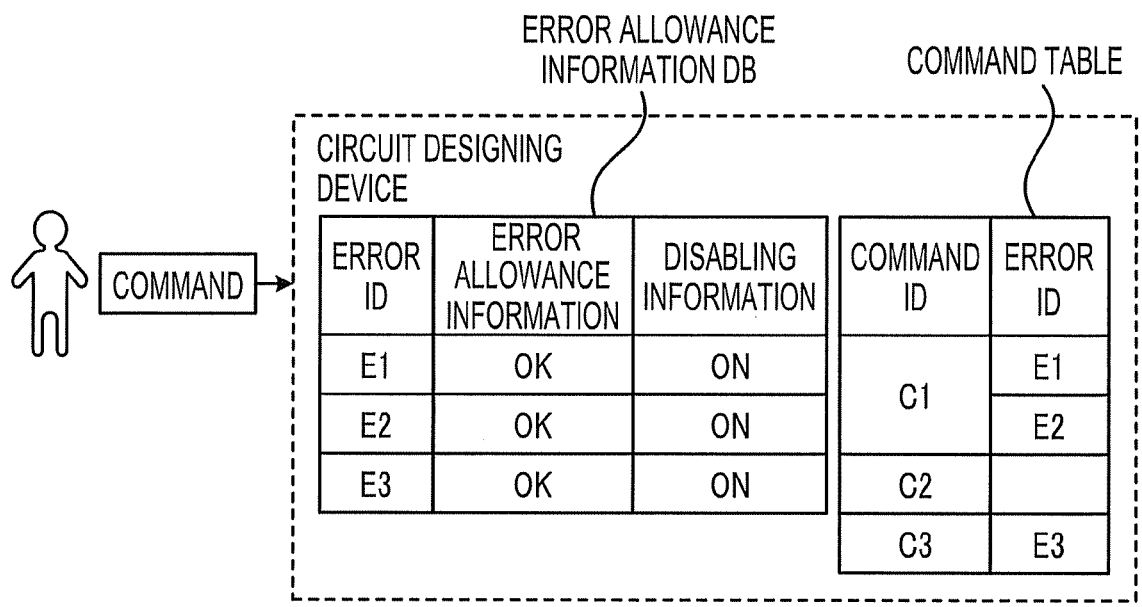
FIGS. 2A and 2B are diagrams illustrating an overview and characteristics of a circuit designing device according to embodiment 1.

Specifically, as shown in FIG. 2A, the circuit designing device of embodiment 1 stores, in an error allowance information DB (database), error allowance information which allows issue of warning to be prevented and disabling information (disabling) which cancels the error allowance information to permit issue of warning in association with each error ID which identifies a respective error.

Further, the circuit designing device of embodiment 1 stores, in a command table, a command ID which identifies an edit command for editing a generated circuit diagram data in association with the error ID.

Figure 2B:
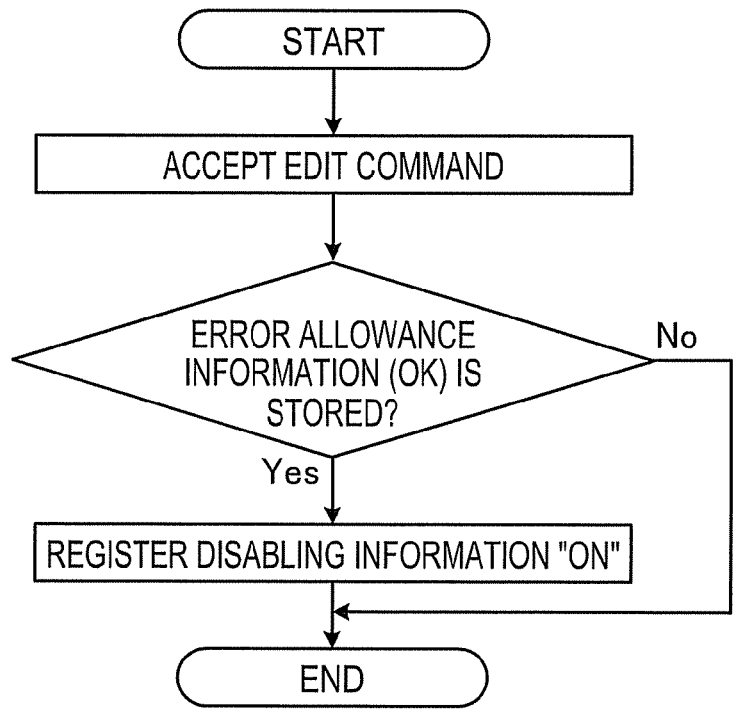

Then, as shown in FIG. 2B, when accepting the edit command, the circuit designing device of embodiment 1 acquires the error ID stored in association with the command ID of the edit command in the command table, and registers disabling information "ON" if error allowance information "OK" has been stored in association with the acquired error ID.

When accepting an operation for checking a circuit diagram, the circuit designing device of embodiment 1 checks errors corresponding to respective error IDs stored in the error allowance information DB respectively.

Then, the circuit designing device of embodiment 1 determines, for each error ID corresponding to a detected error, whether or not to issue a warning based on the allowance information and disabling information stored in association with the relevant error ID in the error allowance information DB, and issues the warning if it determines that the warning should be issued.

Thus, as can been seen from the above described features, the circuit designing device of embodiment 1 can prevent errors from being unnoticed.

Configuration of the Circuit Designing Device

Figure 3:
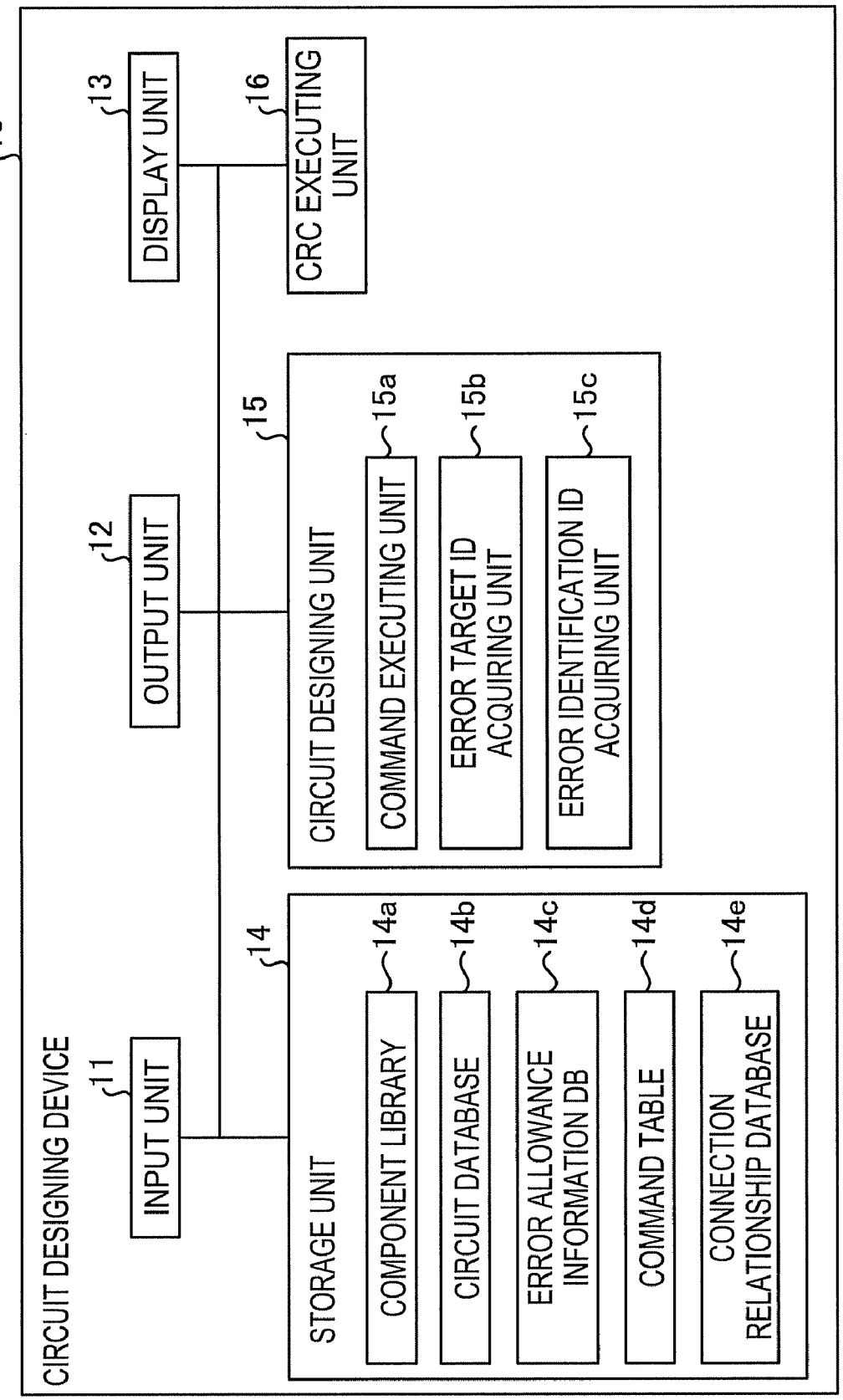
FIG. 3 is a block diagram showing a configuration of the circuit designing device.

The configuration of the circuit designing device shown in FIG. 2 will be described with reference to FIGS. 3 to 7. As shown in FIG. 3, this circuit designing device 10 includes an input unit 11, an output unit 12, a display unit 13, a storage unit 14, a circuit designing unit 15, and a DRC executing unit 16.

The input unit 11 accepts input of various information. Specifically, the input unit 11 includes a keyboard, a mouse, and the like, and accepts, for example, a draw command for drawing a circuit diagram and an edit command for editing a generated circuit diagram.

An edit command as used herein is a command, for example, which "moves" a net N1 shown in FIG. 4A to the position shown in FIG. 4B. The circuit designing device of embodiment 1 has edit commands shown in FIG. 4C.

The output unit 12 outputs various information. Specifically, the output unit 12 corresponds to a printer or the like, and outputs data of a circuit diagram.

The display unit 13 displays various information. Specifically, the display unit 13 corresponds to a monitor, a display, or the like, and displays a circuit diagram.

The storage unit 14 stores data and a program required for various processing. As particularly relevant elements, the storage unit 14 has a component library 14a, a circuit database 14b, an error allowance information DB 14c, a command table 14d, and a connection relationship database 14e.

The error allowance information DB 14c, the command table 14d, the connection relationship database 14e correspond to "error identification information storing means", "instruction identification information storing means", and "connection relationship storing means" described in the claims, respectively.

The component library 14a stores data of a component used when a circuit diagram is drawn. The circuit database 14b stores data of a circuit diagram.

The error allowance information DB 14c stores error allowance information which allows issue of warning to be prevented and disabling information which cancels the error allowance information to permit issue of warning in association with each error ID which identifies a respective error.

Specifically, the error allowance information DB 14c has a database structure as shown in FIG. 5A, and stores various information as shown in FIG. 5B. In FIG. 5B, the error ID refers to an ID for identifying an error. The permitter name refers to information of a user who allows an error (that is, suspends issue of warning). The reason for allowance refers to a comment about the reason for allowance and the like. The error target ID refers to an identification (ID) of a target (e.g., a component, a net) about which an error is outputted. The error target type refers to a type (e.g., a component, a net, a power source symbol) of target about which an error is outputted.

The error allowance information refers to information for allowing a warning to be prevented when an error is detected. For example, if a user checks an error description on receipt of a warning and inputs a command intended to suspend issue of warning about this error, the error allowance information is switched from "Not OK" indicating the error causes issue of warning to "OK" indicating the error does not cause issue of warning.

The disabling refers to information which identifies whether error allowance information is disabled or not. In other words, an error corresponding to a combination of error allowance information "OK" and disabling information "OFF" is an error which does not cause issue of warning. An error corresponding to a combination of error allowance information "OK" and disabling information "ON" is an error which causes issue of warning.

The command table 14d stores a command ID which identifies an edit command for editing a generated circuit diagram in association with an error ID. Specifically, the command table 14d stores an error type ID (error ID) in association with a command ID as shown in FIG. 6A.

For example, as shown in FIG. 6B, the command table 14d stores ID "y" of the error type "there are no input/output pins in one net" in association with ID "x" of the edit command "move". Each information stored in the command table 14d is information stored in advance.

Figure 7A:
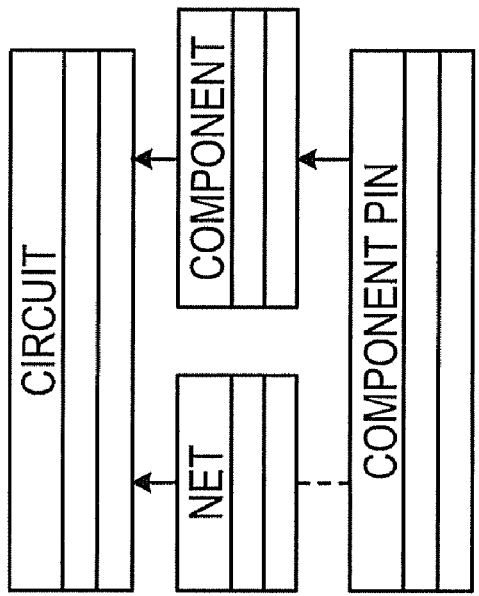
FIGS. 7A, 7B, and 7C are diagrams illustrating information stored in a connection relationship database.
Figure 7B:
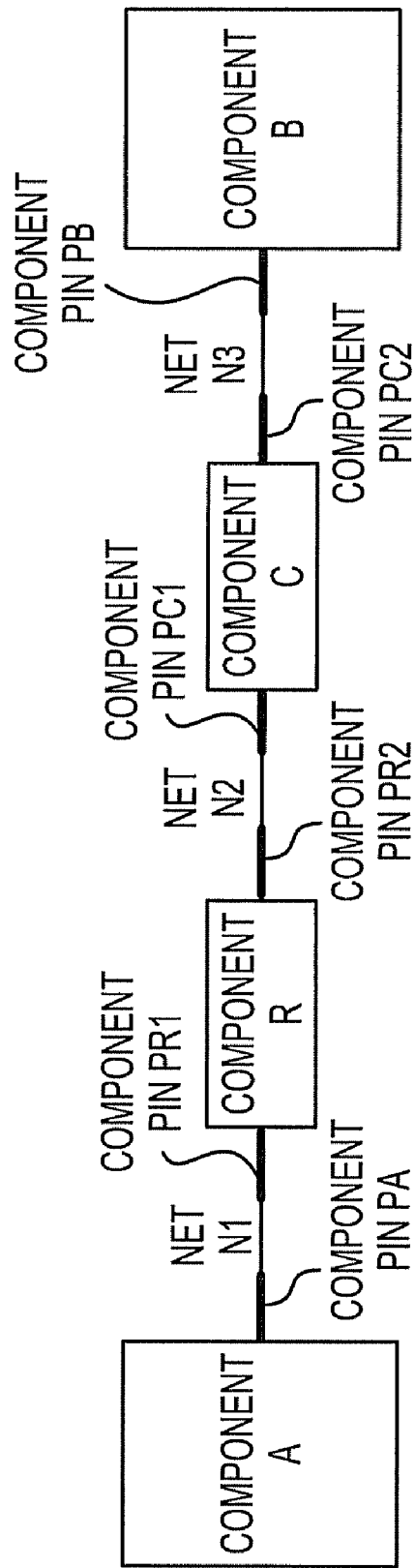

The connection relationship database 14e stores a connection relationship of each component drawn in a circuit diagram. Specifically, the connection relationship database 14e has a database structure as shown in FIG. 7A. For example, when the circuit diagram as shown in FIG. 7B is drawn, the connection relationship database 14e stores information as shown in FIG. 7C.

Figure 7C:
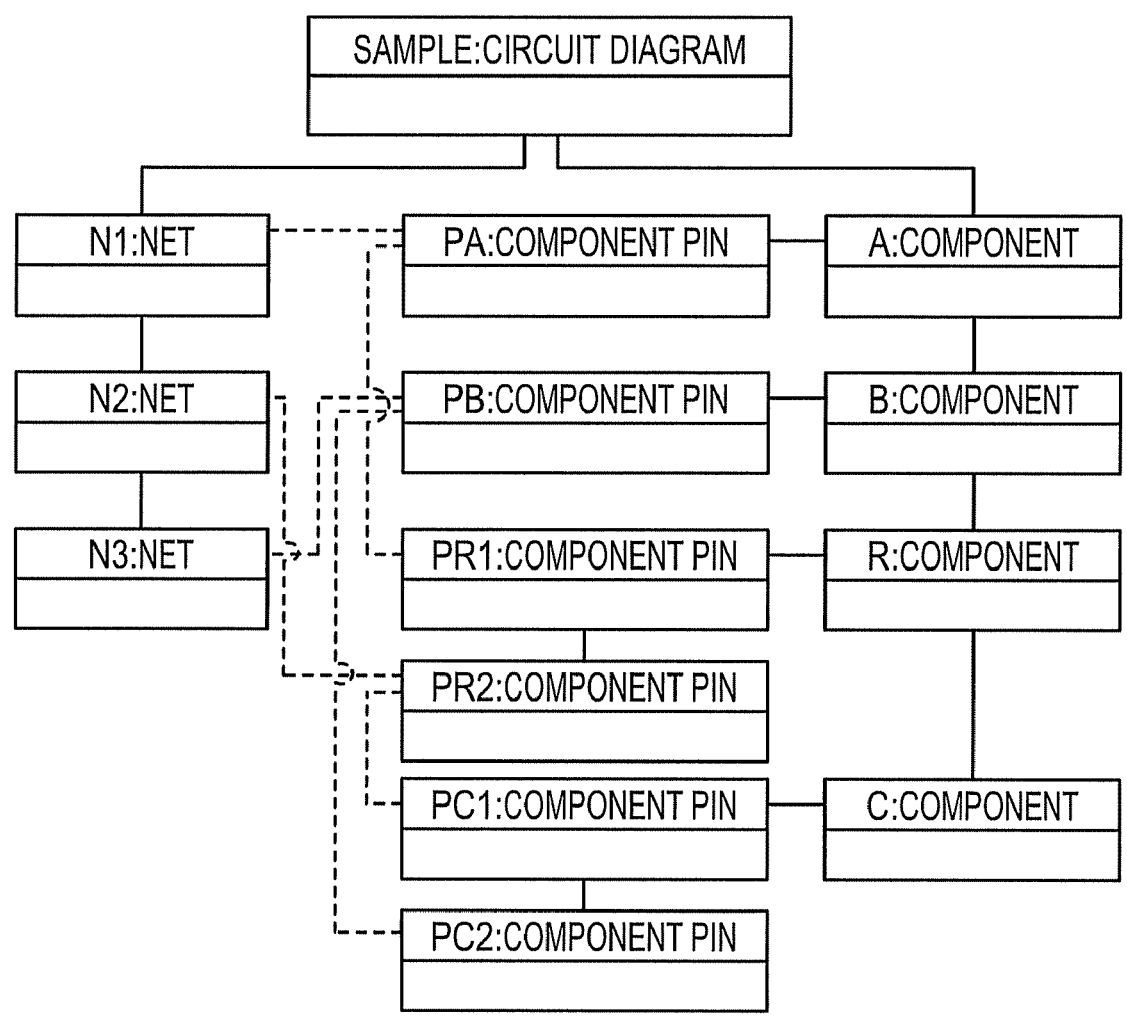

For example, in FIG. 7C, it is represented that a component R is connected to a net N1 through a component pin PR1 and connected to a net N2 through a component pin PR2. Further, the net N1 is connected to a component A through a component pin PA and connected to the component R through the component pin PR1.

The circuit designing unit 15 generates a circuit diagram. As particularly relevant elements, the circuit designing unit 15 has a command executing unit 15a, an error target ID acquiring unit 15b, and an error ID acquiring unit 15c.

The error ID acquiring unit 15c corresponds to "error identification information acquiring means" and "cancel information registering means" described in the claims, and the error target ID acquiring unit 15b corresponds to "component ID acquiring means" described in the claim.

The command executing unit 15a corresponds to a circuit design application or the like, and execute a command. Specifically, when accepting a command, the command executing unit 15a updates information stored in the circuit database 14b and the connection relationship database 14e.

For example, when accepting a command for drawing a new component, the command executing unit 15a reads data of the component from the component library 14a and writes the component data in circuit diagram data stored in the circuit database 14b.

Then, the command executing unit 15a stores the error ID, error target (ID), error target (type), error allowance information "NG", and disabling information "OFF" in the error allowance information DB 14c. Then, the command executing unit 15a updates the connection relationship of components stored in the connection relationship database 14e.

When the error target ID acquiring unit 15b accepts an edit command, the error target ID acquiring unit 15b acquires an error target ID included in the edit command and an error target ID of a connected component having a connection relationship with a component identified by the error target ID included in the edit command. Specifically, the error target ID acquiring unit 15b acquires an error target ID of a connected component having a connection relationship with a component identified by an error target ID included in the edit command with reference to the connection relationship database 14e. Then, the error target ID acquiring unit 15b notifies the error ID acquiring unit 15c of the error target ID included in the edit command and the acquired error target ID.

For example, when the command executing unit 15a accepts an edit command for moving the net N1, the error target ID acquiring unit 15b identifies that the net N1 is connected to the component A and the component R with reference to the connection relationship 14e, and acquires an ID of the component A and the ID of the component R. Then, the error target ID acquiring unit 15b notifies the error ID acquiring unit 15c of the ID of the net N1, the ID of the component A, and the ID of the component R.

When accepting the edit command, the error ID acquiring unit 15c acquires an error ID corresponding to the command ID of the edit command. Then, the error ID acquiring unit 15c registers disabling information in association with the acquired error ID.

Specifically, the error ID acquiring unit 15c acquires an error target ID corresponding to the command ID of the edit command with reference to the command table 14d. Then, the error ID acquiring unit 15c changes disabling information from "OFF" to "ON" with respect to an error ID corresponding to a combination of "error target ID acquired with reference to the command table 14d" and "error target ID accepted from the error target ID acquiring unit 15b" among each error ID stored in the error allowance information DB 14c.

For example, the command executing unit 15a accepts an edit command for moving the net N, and the error ID acquiring unit 15c then accepts the ID of the net N1 from the error target ID acquiring unit 15b.

The error ID acquiring unit 15c acquires ID "y" of the error type "there are no input/output pins in one net" corresponding to ID "x" of the edit command "move" with reference to the command table 14d.

Then, the error ID acquiring unit 15c changes, from "OFF" to "ON", disabling information stored in the error allowance information DB 14c corresponding to a combination of ID "y" of the error type "there are no input/output pins in one net" and ID "N1" of the net N1.

The DRC executing unit 16 corresponds to a design rule check (DRC) mechanism, and checks an error in a circuit diagram. The DRC executing unit 16 corresponds to "error checking means", "warning permission determining means", and "warning issuing means" described in the claims.

Specifically, when accepting an operation for checking the circuit diagram is accepted, the DRC executing unit 16 reads data of the circuit diagram from the circuit database 14b, and checks a respective error corresponding to each error ID with reference to the error allowance information DB 14c.

Then, the DRC executing unit 16 determines, for each error ID corresponding to a detected error, whether or not to issue a warning based on error allowance information and disabling information stored in association with the relevant error ID in the error allowance information DB 14c, and issues the warning if it determines that the warning should be issued.

For example, the DRC executing unit 16 issues a warning if there has been stored a combination of error allowance information "OK" and disabling information "ON", a combination of error allowance information "Not OK" and disabling information "ON", or a combination of error allowance information "Not OK" and disabling information "OFF". On the other hand, the DRC executing unit 16 suspends issue of warning if a combination of error allowance information "OK" and disabling information "OFF" has been stored.

Processing by Circuit Designing Device

Next, processing by the circuit designing device 10 will be described with reference to FIGS. 8 and 9.

Figure 8:
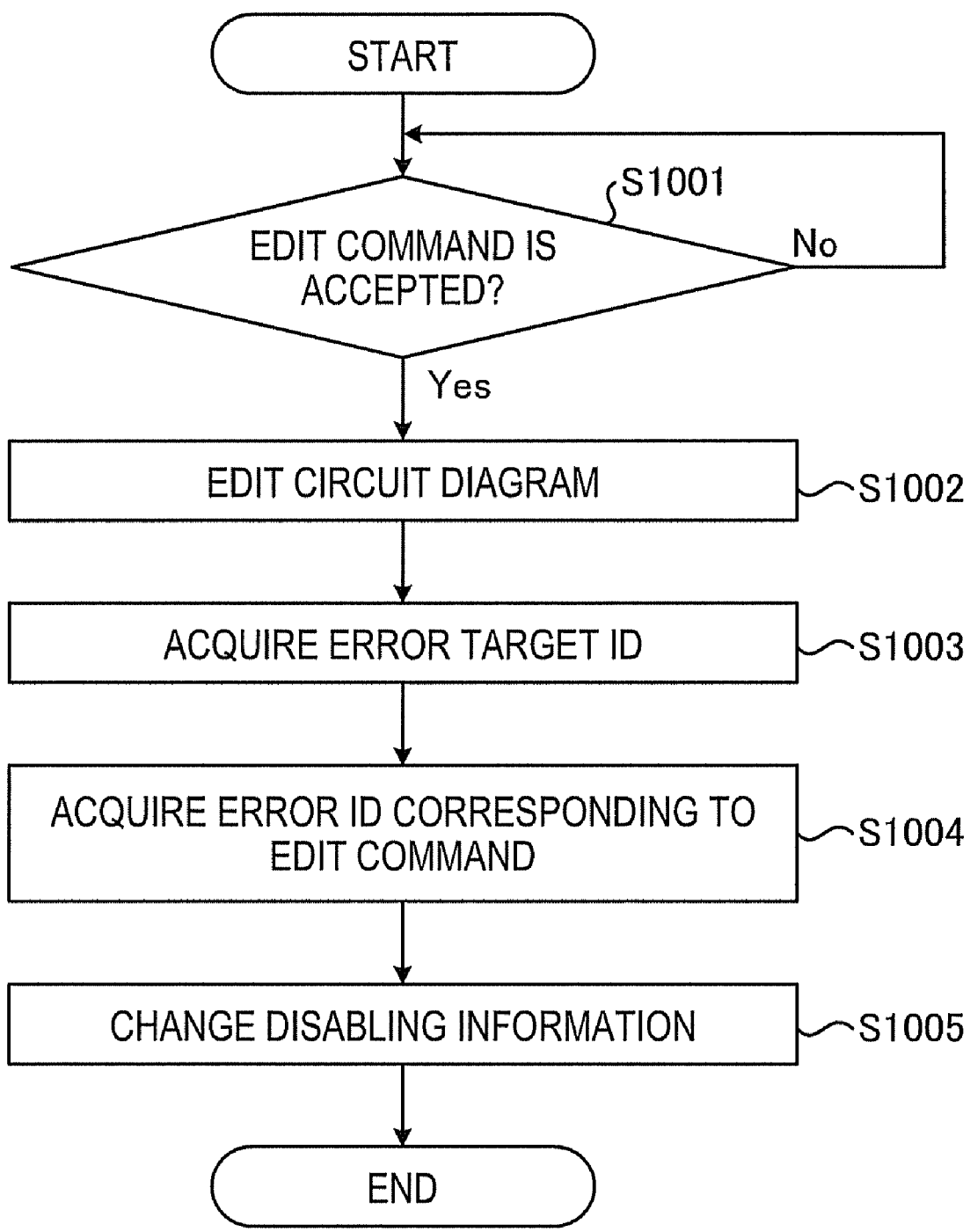
FIG. 8 is a flowchart of editing processing by the circuit designing device.

As shown in FIG. 8, when the circuit designing device 10 accepts an edit command (S1001: Yes), the circuit designing device 10 edits a circuit diagram (S1002), and acquires an error target ID (S1003).

Then, the circuit designing device 10 acquires an error ID corresponding to the edit command (1004), changes disabling information corresponding to the acquired error ID from "OFF" to "ON" (S1005), and completes the editing processing.

Figure 9:
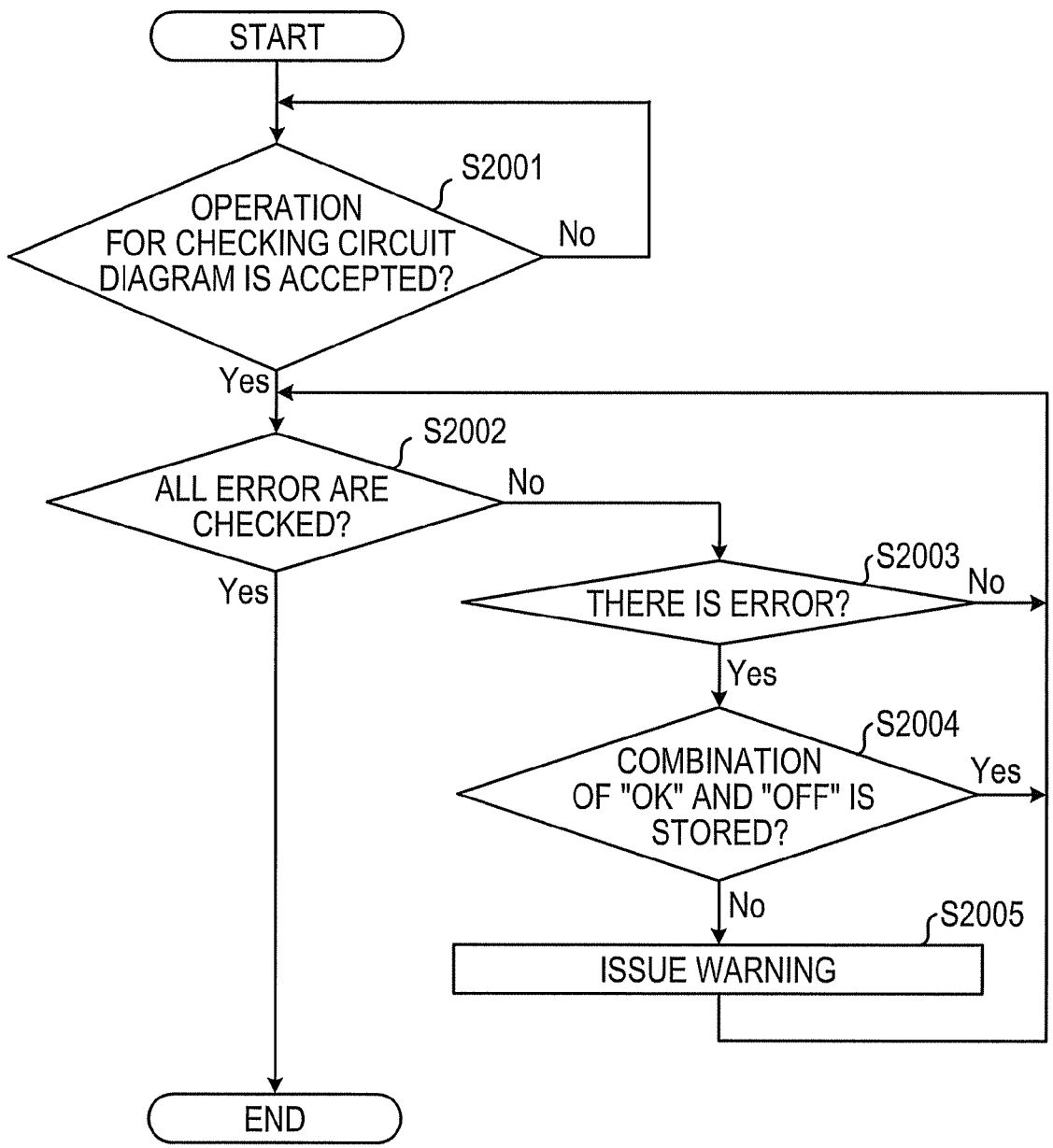
FIG. 9 is a flowchart of check processing by the circuit designing device.

As shown in FIG. 9, in the following description, the circuit designing device 10 is supposed to execute check processing for each error ID until all errors are checked (S2002: No), and complete the check processing when it determines that all the errors have been checked (S2002: Yes).

The circuit designing device 10 accepts an operation for checking a circuit diagram (S2001: Yes, S2002: No), and then determines whether or not there is an error (S2003).

If the circuit designing device 10 determines that there is an error (S2003: Yes), it checks error allowance information and disabling information (S2004).

If there has been stored a combination of error allowance information "OK" and disabling information "ON", a combination of error allowance information "Not OK" and disabling information "ON", or a combination of error allowance information "Not OK" and disabling information "OFF" (S2004: No), the circuit designing device 10 issues a warning (S2005), and determines whether all errors have checked or not (S2002).

On the other hand, if a combination of error allowance information "Not OK" and disabling information "OFF" has been stored (S2004: Yes), the circuit designing device 10 suspends issue of warning, and determines whether all errors have checked or not (S2002).

Example of Processing by the Circuit Designing Device

Next, an example of processing by the circuit designing device 10 will be described with reference to FIGS. 10 to 12.

Assumption

First, there will be described the assumptions on which one example of processing by the circuit designing device 10 will be described. The assumptions are as follows. A circuit diagram shown in FIG. 10A has already been created by a user. The circuit designing device 10 is supposed to check errors with respect to check items as shown in FIG. 10B. For example, the circuit designing device 10 checks whether all component pins of a component (the component R1 in No. "1" in FIG. 5B) identified by an error target ID are used with respect to an error ID whose check type is "all component pins are unused" and which corresponds to an error target type "component".

Then, the circuit designing device 10 issues a warning to the user, and accepts one of commands shown in FIG. 10C as a response to the warning.

For example, No. "1" in FIG. 10C indicates a command which allows an error of an error ID which is associated with an error target ID that identifies the component R1 and whose check type is "all pins are unused" (see No. "1" in FIG. 5B). In other words, it is a command for suspending issue of warning even if all the component pins which the component R1 has are unused.

In addition, the circuit designing device 10 stores command IDs and error type IDs in the command table 14*d* so that the edit command and the error type have the correspondence relation shown in FIG. 10D.

On the above assumption, the error allowance information DB 14*c* stores each information shown in FIG. 11A, the command table 14*d* stores each information shown in FIG. 11B, and the connection relationship database 14*e* stores each information shown in FIG. 11C. In FIG. 11, for convenience of description, information stored in the error allowance information DB 14*c*, the command table 14*d*, and the connection relationship database 14*e* are illustrated in a simplified manner respectively.

The error IDs "E1", "E2", "E3" correspond to the ID of "all component pins are unused", the ID of "there are no input/output pins in one net", and the ID of "input error of component attribute", respectively.

The command IDs "C1", "C2", "C3", and "C4" correspond to edit commands "move", "change name", "change attribute", and "copy", respectively.

Situation 1

Situation 1 will be described in which editing processing to "move the component R1 such that the component R1 is not connected with the net N1" is executed. The circuit designing device 10 accepts an edit command including "C1" and "R1", and updates information stored in the circuit database 14*b* and the connection relationship database 14*e* (although in this situation 1, information stored in the connection relationship database 14*e* is not updated).

Then, the circuit designing device 10 acquires "R1" with reference to the connection relationship database 14*e* because an error target ID of a connection destination corresponding to "R1" is not stored. Further, the circuit designing device 10 acquires "E1" and "E2" corresponding to "C1" with reference to the command table 14*d*.

Then, the circuit designing device 10 changes, from "OFF" to "ON", disabling information stored in the error allowance information DB 14*c* corresponding to a combination of "E1" and "R1". Then, since a combination of "E2" and "R1" is not stored in the error allowance information DB 14*c*, the circuit designing device 10 completes the editing processing.

Situation 2

Situation 2 will be described in which editing processing to "move the component R1 such that the component R1 is connected with the net N1" is executed. The circuit designing device 10 accepts an edit command including "C1" and "R1", and updates information stored in the circuit database 14*b* and the connection relationship database 14*e* (see (A-1) and (A-2) in FIG. 12).

Then, the circuit designing device 10 acquires "R1" and "N1" with reference to the connection relationship database 14*e*. Further, the circuit designing device 10 acquires "E1" and "E2" corresponding to "C1" with reference to the command table 14*d*.

Then, the circuit designing device 10 changes, from "OFF" to "ON", disabling information stored in the error allowance information DB 14*c* corresponding to a combination of "E1" and "R1" and a combination of "E2" and "N2", respectively. Then, since a combination of "E2" and "R1" and a combination of "E1" and "N1" are not stored in the error allowance information DB 14*c*, the circuit designing device 10 completes the editing processing.

Situation 3

Situation 3 will be described in which editing processing to "copy the net N1 to draw a new net N3" is executed. The circuit designing device 10 accepts an edit command including "C4" and "N3", and updates information stored in the circuit database 14*b* (see FIG. 12B), the error allowance information DB 14*c*, and the connection relationship database 14*e*.

Then, the circuit designing device 10 acquires "N3" with reference to the connection relationship database 14*e* because an error target ID of a connection destination corresponding to "N3" is not stored. Further, the circuit designing device 10 acquires "E1" and "E2" corresponding to "C4" with reference to the command table 14*d*.

Then, since a combination of "E1" and "N3" and a combination of "E2" and "N3" are not stored in the error allowance information DB 14*c*, the circuit designing device 10 completes the editing processing.

Situation 4

Situation 4 will be described in which editing processing to "copy the net N1 to make three connection destinations to which the net N1 connects" is executed. The circuit designing device 10 accepts an edit command including "C4" and "N1", and updates information stored in the circuit database 14*b* (see FIG. 12C) and the connection relationship database 14*e*.

Then, the circuit designing device 10 acquires "N1", "R2", and "R3" with reference to the connection relationship database 14*e* (the description about "R2" and "R3" will be omitted here). Further, the circuit designing device 10 acquires "E1" and "E2" corresponding to "C4" with reference to the command table 14*d*.

Then, the circuit designing device 10 changes, from "OFF" to "ON", disabling information stored in the error allowance information DB 14*c* corresponding to a combination of "E2" and "N1". Then, since a combination of "E1" and "N1" is not stored in the error allowance information DB 14*c*, the circuit designing device 10 completes the editing processing.

Situation 5

Situation 5 will be described in which editing processing to "copy the net N1 to make three connection destinations to which the net N1 connects and further to connect new connection destinations to the component R1" is executed. The circuit designing device 10 accepts an edit command including "C4" and "N1", and updates information stored in the circuit database 14*b* and the connection relationship database 14*e* (see (D-1) and (D-2) in FIG. 12).

Then, the circuit designing device 10 acquires "N1" and "R1", "R2", "R3" with reference to the connection relationship database 14e (the description about "R2" and "R3" will be omitted here). Further, the circuit designing device 10 acquires "E1" and "E2" corresponding to "C4" with reference to the command table 14d.

Then, the circuit designing device 10 changes, from "OFF" to "ON", disabling information stored in the error allowance information DB 14c corresponding to a combination of "E1" and "R1" and a combination of "E2" and "N1", respectively. Then, since a combination of "E2" and "R1" and a combination of "E1" and "N1" are not stored in the error allowance information DB 14c, the circuit designing device 10 completes the editing processing.

Situation 6

Situation 6 will be described in which editing processing to "change the name of the net N1" is executed. The circuit designing device 10 accepts an edit command including "C2" and "N1", and updates information stored in the circuit database 14b and the connection relationship database 14e.

Then, the circuit designing device 10 acquires "N1", "R2", and "R3" with reference to the connection relationship database 14e. Then, the circuit designing device 10 refers to the command table 14d, and completes the editing processing because an error ID corresponding to "C2" is not stored there.

Situation 7

Situation 7 will be described in which editing processing to "delete the component R1" is executed. The circuit designing device 10 accepts an edit command including "R1", updates information stored in the circuit database 14b, the error allowance information DB 14c, and the connection relationship database 14e (see (E-1) and (E-2) in FIG. 12), and completes the editing processing.

Advantages of Embodiment 1

As described above, according to embodiment 1, errors can be prevented from being unnoticed. For example, in the above described situation 1, although the circuit designing device 10 of embodiment 1 accepts a command for suspending issue of warning even if component pins which the component R1 has are all unused, suspension of issue of warning is cancelled due to acceptance of the edit command to "move the component R1". Therefore, errors can be prevented from being unnoticed.

Further, according to embodiment 1, errors about a component having a connection relationship with a component edited by an edit command can be prevented from being unnoticed. For example, in the above described situation 2, since suspension of issue of warning about the net N1 is cancelled due to acceptance of the edit command to "move the component R1 such that the component R1 is connected with the net N1", errors can be prevented from being unnoticed.

Further, according to embodiment 1, since disabling information "ON" (or "OFF") is stored for each error ID, an error about which suspension of issue of warning should be cancelled can be easily discriminated from an error about which suspension of issue of warning should not be cancelled.

Embodiment 2

Although the foregoing has described embodiment 1, the present invention may be embodied in various forms other than the above embodiment. Another embodiment will be described as embodiment 2 below.

Although disabling information is changed from "OFF" to "ON" to allow a warning to issue with respect to an error in embodiment 1, the present invention is not limited to this. For example, a flag may be set which identifies an error ID which causes issue of warning.

Further, error allowance information corresponding to a combination of "error target ID acquired with reference to the command table 14d" and "error target ID accepted from the error target ID acquiring unit 15b" may be switched from "OK" to "NG" in the present invention.

Although a warning with respect to an error is issued in embodiment 1, a method of error notification does not limit the present invention. For example, an error message may be displayed using a GUI (Graphical User Interface).

Although an error target ID of a component having a connection relationship with an edited component is acquired with reference to the connection relationship database 14e in embodiment 1, a method for acquiring an error target ID of a component having a connection relationship does not limit the present invention. For example, it may be acquired with reference to a circuit diagram.

The processing procedures, control procedures, specific names, information including various types of data and parameters (for example, database structures and storage information shown in FIGS. 2, 5, 6, 7, and 11) in the foregoing description and the drawings may be changed in any manner unless otherwise noted.

The elements of each device shown in the drawings are functional concepts, and do not necessarily configured physically as illustrated. In other words, specific forms of distribution and integration of the devices are not limited to the drawings, and all or part thereof may be distributed or integrated functionally or physically in any units depending on loads, use statuses, and the like. For example, the error target ID acquiring unit 15b and error ID acquiring unit 15c shown in FIG. 3 may be configured to be integrated.

Further, all or part of the processing functions executed in the devices may be implemented by a CPU or by a program parsed and executed by the CPU, or may be implemented as hardware.

The warning method described in the present embodiments is intended for circuit design. However, it may also be applied to physical design and structural design. For example, the warning method may be applied to design of transport machinery, a moving apparatus, a building, and the like. Further, it may be applied to design of a network of information processing devices.

According to an aspect of an embodiment of the invention, any combinations of the described features, functions, operations, and/or benefits can be provided. The embodiments can be implemented as an apparatus (a machine) that includes computing hardware (i.e., a computing apparatus), such as (in a non-limiting example) any computer that can store, retrieve, process and/or output data and/or communicate (network) with other computers. According to an aspect of an embodiment of the invention, the described features, functions, operations, and/or benefits can be implemented by and/or use computing hardware and/or software, namely the circuit designing device 10 is a computing apparatus programmed to execute the described operations. A computing apparatus comprises a computer processor or controller (CPU) (e.g., a hardware logic circuitry based computer processor that processes or executes instructions, namely software), computer readable recording media, transmission communication media interface (network interface), and/or a display device, all in communication through a data communication bus. The results produced can be displayed on a display of the computing hardware. A program/software implementing the embodiments may be recorded on computer readable media comprising computer-readable recording media. The program/software implementing the embodiments may also be included/encoded and transmitted over transmission communication media.

Further, the described processes can be implemented by programming a computer to execute/process the processes as particular functions pursuant to instructions from program software and/or data structures described herein to create a new special purpose machine, namely to transform a general purpose machine into a special purpose machine. In particular, the processes when executed by the computer transform the computer processor as an article into a circuit designing device including an error warning function as described herein as a different state and/or thing.

A warning device checks for errors in design object data and issues a warning for detected errors by storing allowance information, which allows issuance of warning prevention, cancel information, which cancels relevant allowance information to permit issuance of warning for each error identification, and editing instruction identification (corrective action), which identifies an edit command for editing generated design object data for error identification. In other words, an edit command is associated with a type of error. When said edit command is accepted, the error identification for the instruction identification of edit command is acquired. Cancel information can be registered for error identification. Respective errors corresponding to error identifications are checked, when an operation for checking the design object data is accepted, and when a type of an error is identified, whether to issue a warning based on the allowance information and cancel information for relevant error identification is determined.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A warning device which checks an error in design object data and issues a warning with respect to each detected error, the warning device comprising:
    an error identification information storing unit to store allowance information which indicates issuance of a warning to be prevented and cancel information which indicates cancellation of relevant allowance information to permit issuance of a warning in association with each error identification information which identifies a respective error;
    an instruction identification information storing unit to store instruction identification information which identifies an edit command for editing the design object data in association with said error identification information;
    an error checking unit to check for a respective error corresponding to each of the error identification information stored in said error identification information storing unit when an operation for checking the design object data is accepted;
    an error identification information acquiring unit to, when an edit command is accepted in response to an error detected by the error checking unit, acquire the error identification information stored in association with the instruction identification information of said edit command in said instruction identification information storing unit;
    a cancel information registering unit to register said cancel information in said error identification information storing unit in association with the acquired error identification information associated with said edit command;
    a warning permission determining unit to, for each error identification information corresponding to an error detected by said error checking unit, determine whether to issue a warning based on the allowance information and cancel information stored in association with the relevant error identification information in said error identification information storing unit; and
    a warning issuing unit to issue the warning if said warning permission determining unit determines that the warning should be issued.

2. The warning device according to claim 1, wherein if the cancel information corresponding to the error detected by said error checking unit is valid, said warning permission determining unit determines to issue the warning.

3. The warning device according to claim 1, wherein said error identification information storing unit stores a component ID which identifies a component drawn in a design object data in association with error identification information, the warning device further comprising:
    a connection relationship storing unit to store a connection relationship of each component drawn in the design object data each time the design object data is updated by a draw command and said edit command; and
    a component ID acquiring unit to, when said edit command is accepted, acquiring a component ID included in said edit command and a component ID of a connected component having a connection relationship with a component identified by the component ID included in said edit command, with reference to said connection relationship storing unit, and
    wherein said cancel information registering unit registers cancel information with respect to error identification information corresponding to a combination of each component ID acquired by said component ID acquiring unit and error identification information acquired by said error identification information acquiring unit from among each of the error identification information stored in said error identification information storing unit.

4. A method of warning of an error in design object data, the method comprising:
    storing allowance information which indicates issuance of a warning to be prevented and cancel information which indicates cancellation of relevant allowance information to permit issuance of a warning in association with each error identification information which identifies a respective error;
    storing instruction identification information which identifies an edit command for editing the design object data in association with said error identification information;
    checking for errors corresponding to each stored error identification information, according to checking the design object data, using a computer;
    when an edit command is accepted in response to an error detected by the error checking, acquiring the error identification information stored in association with the instruction identification information of said edit command;

registering said cancel information in association with the acquired error identification information associated with said edit command;

for each error identification information corresponding to an error detected by said error checking, determining whether to issue a warning based on the allowance information and cancel information stored in association with the relevant error identification information; and issuing the warning according to said warning permission determining.

* * * * *